(12) United States Patent
Takuma et al.

(10) Patent No.: US 11,128,288 B2
(45) Date of Patent: Sep. 21, 2021

(54) SWITCHING DEVICE

(71) Applicant: Rohm Co., Ltd., Kyoto (JP)

(72) Inventors: Toru Takuma, Kyoto (JP); Shuntaro Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/726,461

(22) Filed: Dec. 24, 2019

(65) Prior Publication Data

US 2020/0212664 A1 Jul. 2, 2020

(30) Foreign Application Priority Data

Dec. 26, 2018 (JP) .................................. 2018-242453
Dec. 4, 2019 (JP) ............................. JP2019-219320

(51) Int. Cl.
| | | |
|---|---|---|
| *H03K 17/0812* | (2006.01) |
| *B60R 16/02* | (2006.01) |
| *H03K 17/14* | (2006.01) |
| *H02H 9/04* | (2006.01) |
| *H02H 3/087* | (2006.01) |
| *H02H 1/00* | (2006.01) |
| *H03K 17/687* | (2006.01) |

(52) U.S. Cl.
CPC ....... *H03K 17/08122* (2013.01); *B60R 16/02* (2013.01); *H02H 1/0007* (2013.01); *H02H 3/087* (2013.01); *H02H 9/04* (2013.01); *H03K 17/145* (2013.01); *H03K 17/687* (2013.01)

(58) Field of Classification Search
CPC ......... H03K 17/08104; H03K 17/0812; H03K 17/08122; H03K 17/0814; H03K 17/08142; H03K 17/0806; H03K 17/081–08148; H03K 17/145; H02H 1/0007; H02H 9/005; H02H 9/02; H02H 9/025; H02H 9/041; H02H 9/042; H02H 9/04–046; H02H 3/087
See application file for complete search history.

(56) References Cited

U.S. PATENT DOCUMENTS

2017/0256938 A1* 9/2017 Fukuhara ................. H02H 9/04
2017/0346274 A1* 11/2017 Nakahara ........... H03K 17/0822

FOREIGN PATENT DOCUMENTS

WO 2017/187785 11/2017

* cited by examiner

*Primary Examiner* — Jared Fureman
*Assistant Examiner* — Christopher J Clark
(74) *Attorney, Agent, or Firm* — Fish & Richardson P.C.

(57) ABSTRACT

A switching device has, for example, a first terminal configured to be connected to an application node for a first voltage, a second terminal configured to be connected to the first end of a load, a third terminal configured to be connected to the second end of the load and to an application node for a second voltage, a switching element configured to be connected between the first and second terminals, a first active clamper configured to limit the output voltage at the second terminal with reference to the first voltage in a first state, and a second active clamper configured to limit the output voltage with reference to the second voltage in a second state different from the first state.

18 Claims, 8 Drawing Sheets

SWITCHING DEVICE

CROSS-REFERENCE TO RELATED APPLICATIONS

This application is based on the following Japanese Patent Applications, the contents of which are hereby incorporated by reference:
(1) Japanese Patent Application published as No. 2018-242453, filed on Dec. 26, 2018
(2) Japanese Patent Application published as No. 2019-219320, filed on Dec. 4,2019

BACKGROUND OF THE INVENTION

1. Field of the Invention

The invention disclosed herein relates to a switching device.

2. Description of Related Art

The applicant of this application has been proposing a number of new techniques (see, for example, WO 2017/187785) related to switching devices such as vehicle-mounted IPDs (intelligent power devices).

However, the conventional switching devices mentioned above still have room for improvement in, for example, active clamping operation in a high-temperature state.

In particular, nowadays, vehicle-mounted ICs are required to comply with ISO 26262 (an international standard for functional safety of electrical and/or electronic systems in production automobiles). Thus, also in vehicle-mounted IPDs, designing aimed at still higher reliability is important.

SUMMARY OF THE INVENTION

In view of the above-mentioned challenge encountered by the present inventors, an object of the invention disclosed herein is to provide a switching device which can, for example, optimize active clamping operation in a high-temperature state.

According to one aspect of what is disclosed herein, a switching device has, for example, a first terminal configured to be connected to an application node for a first voltage, a second terminal configured to be connected to the first end of a load, a third terminal configured to be connected to the second end of the load and to an application node for a second voltage, a switching element configured to be connected between the first and second terminals, a first active clamper configured to limit the output voltage at the second terminal with reference to the first voltage in a first state, and a second active damper configured to limit the output voltage with reference to the second voltage in a second state different from the first state.

Other features, elements, steps, benefits, and characteristics of the present invention will become clearer with reference to the following description of preferred embodiments thereof in conjunction with the accompanying drawings.

DETAILED DESCRIPTION OF PREFERRED EMBODIMENTS

Semiconductor Integrated Circuit Device (Overall Configuration)

Figure 1:
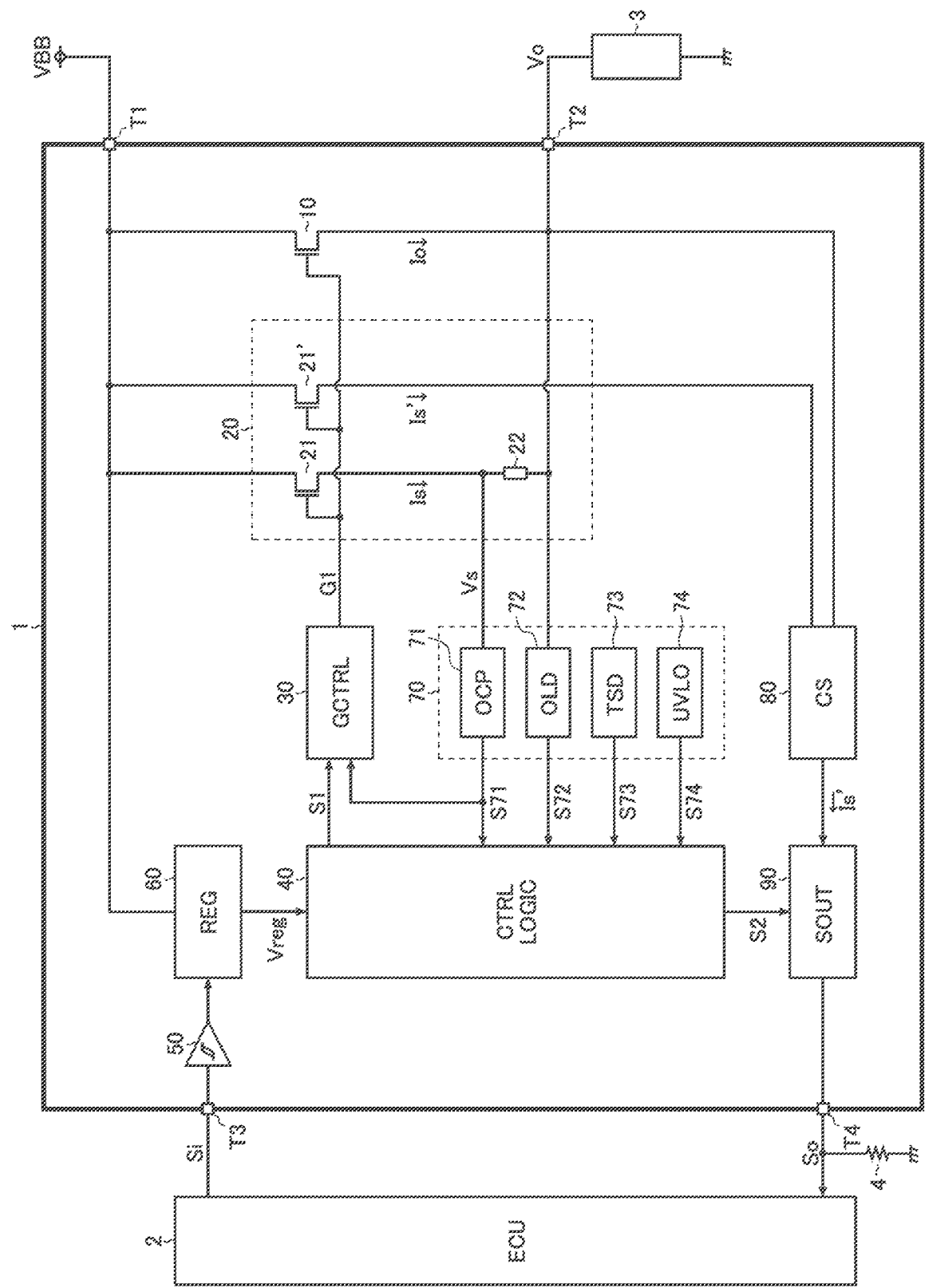
FIG. 1 is a block diagram showing an overall configuration of a semiconductor integrated circuit device.

FIG. 1 is a block diagram showing an overall configuration of a semiconductor integrated circuit device. The semiconductor integrated circuit device 1 of this embodiment is a high-side switch IC (a kind of vehicle-mounted IPD) for vehicle-mounted applications which switches between conducting and cut-off states a path between an application node for a supply voltage VBB and a load 3 in response to instructions from an ECU (electronic control unit) 2.

The semiconductor integrated circuit device 1 includes, as a means for establishing electrical connection with outside the device, external terminals T1 to T4. The external terminal T1 is a power terminal (VBB pin) for receiving a supply voltage VBB (for example, 12 V) from an unillustrated battery. The external terminal T2 is a load connection terminal or an output terminal (OUT pin) for external connection with a load 3 (such as a bulb lamp, a relay coil, a solenoid, a light emitting diode, or a motor). The external terminal T3 is a signal input terminal (IN pin) for receiving external input of an external control signal Si from the ECU 2. The external terminal T4 is a signal output terminal (SENSE pin) for external output of a status notification signal So to the ECU 2. An external sense resistor 4 is externally connected between the external terminal T4 and the grounded terminal.

The semiconductor integrated circuit device 1 is constituted by integrating together an NMOSFET 10, an output current monitor 20, a gate controller 30, a control logic circuit 40, a signal input circuit 50, an internal power source 60, a fault protector 70, an output current detector 80, and a signal output circuit 90.

The NMOSFET 10 is a power transistor with a high withstand voltage (for example, with a withstand voltage of 42 V) of which the drain is connected to the external terminal T1 and of which the source is connected to the external terminal T2. So connected, the NMOSFET 10 functions as a switching element (a high-side switch) for switching a current path leading from the application node for the supply voltage VBB via the load 3 to the grounded terminal between conducting and cut-off states. The NMOSFET 10 is on when a gate driving signal G1 is at high level, and is off when the gate driving signal G1 is at low level.

The NMOSFET 10 can be designed to have, when fully on, an on-resistance value of several tens of ohms. However, the lower the on-resistance value of the NMOSFET 10 is, the more likely an overcurrent is to occur when a ground fault occurs at the external terminal T2 (when the output is short-circuited to a grounded terminal or a comparable low-potential terminal), and thus the more likely excessive heat is to be produced. Thus, the lower the on-resistance value of the NMOSFET 10 is, the more significant an overcurrent protection circuit 71 and a temperature protection circuit 73, which will be described later, are.

The output current monitor 20 includes NMOSFETs 21 and 21' along with a sense resistor 22 and generates a sense voltage Vs (corresponding to a sense signal) in accordance with an output current Io that passes through the NMOSFET 10.

The NMOSFETs 21 and 21' are both minor transistors connected in parallel with the NMOSFET 10 and generate sense currents Is and Is' in accordance with the output current Io. The size ratio of the NMOSFET 10 to the NMOSFETs 21 and 21' is m:1 (where, m>1). Thus, the sense currents Is and Is' have 1/m (one mth) the magnitude of the output current Io. The NMOSFETs 21 and 21', like the NMOSFET 10, is on when the gate driving signal G1 is at high level, and is off when the gate voltage G2 is at low level.

The sense resistor 22 (with a resistance value Rs) is connected between the source of the NMOSFET 21 and the external terminal T2 and is a current-voltage conversion element that generates the sense voltage Vs (=Is×Rs+Vo, where Vo is the output voltage appearing at the external terminal T2) in accordance with the sense current Is.

The gate controller 30 generates, by increasing the current capability of a gate control signal S1, the gate driving signal G1 to output it to the respective gates of the NMOSFETs 10 and 21; the gate controller 30 thereby performs on/off control of the NMOSFETs 10 and 21. The gate controller 30 has a function of controlling the NMOSFETs 10 and 21 such that the output current Io is limited in accordance with an overcurrent protection signal S71.

The control logic circuit 40 is supplied with an internal supply voltage Vreg to generate the gate control signal S1. For example when the external control signal Si is at high level (the logic level that keeps the NMOSFET 10 on), the internal supply voltage Vreg is supplied from the internal power source 60; thus the control logic circuit 40 is in an operating state, and the gate control signal S1 is at high level (=Vreg). On the other hand, when the external control signal Si is at low level (the logic level that keeps the NMOSFET 10 off), the internal supply voltage Vreg is not supplied from the internal power source 60; thus the control logic circuit 40 is in a non-operating state, and the gate control signal S1 is at low level (=GND). The control logic circuit 40 monitors various fault protection signals (the overcurrent protection signal S71, an open protection signal S72, a temperature protection signal S73, and an undervoltage protection signal S74). The control logic circuit 40 also has a function of generating an output switch signal S2 in accordance with the results of monitoring of, out of the fault protection signals mentioned above, the overcurrent protection signal S71, the open protection signal S72, and the temperature protection signal S73.

The signal input circuit 50 is a Schmitt trigger that receives from the external terminal T3 the external control signal Si and that transmits it to the control logic circuit 40 and to the internal power source 60. The external control signal Si, for example, turns to high level when the NMOSFET 10 is turned on and turns to low level when the NMOSFET 10 is turned off.

The internal power source 60 generates from the supply voltage VBB a predetermined internal supply voltage Vreg and supplies it to different parts of the semiconductor integrated circuit device 1. Whether or not to operate the internal power source 60 is controlled in accordance with the external control signal Si. More specifically, the internal power source 60 is in an operating state when the external control signal Si is at high level and is in a non-operating state when the external control signal Si is at low level.

The fault protector 70 is a circuit block for detecting various kinds of faults in the semiconductor integrated circuit device 1 and includes an overcurrent protection circuit 71, an open protection circuit 72, a temperature protection circuit 73, and an undervoltage protection circuit 74.

The overcurrent protection circuit 71 generates the overcurrent protection signal S71 in accordance with the result of monitoring of the sense voltage Vs (that is, whether an overcurrent fault is occurring with respect to the output current Io). The overcurrent protection signal S71 is, for example, at low level when no fault is being detected and is at high level when a fault is being detected.

The open protection circuit 72 generates the open protection signal S72 in accordance with the result of monitoring of the output voltage Vo (that is, whether an open fault is occurring with respect to the load 3). The open protection signal S72 is, for example, at low level when no fault is being detected and is at high level when a fault is being detected.

The temperature protection circuit 73 includes a temperature sensing element (unillustrated) for detecting overheating of the semiconductor integrated circuit device 1 (especially around the NMOSFET 10) and generates the temperature protection signal S73 in accordance with the result of the detection (that is, whether overheating is occurring). The temperature protection signal S73 is, for example, at low level when no fault is being detected and is at high level when a fault is being detected.

The undervoltage protection circuit 74 generates the undervoltage protection signal S74 in accordance with the result of monitoring of the supply voltage VBB or the internal supply voltage Vreg (that is, whether an undervoltage fault is occurring). The undervoltage protection signal S74 is, for example, at low level when no fault is being detected and is at high level when a fault is being detected.

The output current detector 80 makes the source voltage of the NMOSFET 21' equal to the output voltage Vo using an unillustrated biasing means, and thereby generates, in accordance with the output current Io, the sense current Is' (=Io/m) to output it to the signal output circuit 90.

The signal output circuit 90, based on the output switch signal S2, selectively outputs to the external terminal T4 either the sense current Is' (corresponding to the result of sensing of the output current Io) and the constant voltage V90 (corresponding to a fault flag, unillustrated in FIG. 1). When the sense current Is' is selectively output, an output detection voltage V80 (=Is'×R4) obtained by submitting the sense current Is' to current-to-voltage conversion by the external sense resistor 4 (with a resistance value R4) is transmitted as the status notification signal So to the ECU 2. The higher the output current Io, the higher the output detecting voltage V80, and the lower the output current Io, the lower the output detecting voltage V80. On the other hand, when the constant voltage V99 is selectively output, as the status notification signal So, the constant voltage V90 is transmitted to the ECU 2. When the current value of the output current Io is read from the status notification signal So, the status notification signal So can be subjected to A/D (analog-to-digital) conversion. On the other hand, when the fault flag is read from the status notification signal So, the logical level of the status notification signal So can be checked against a threshold value slightly lower than the constant voltage V90.

Gate Controller

Figure 2:
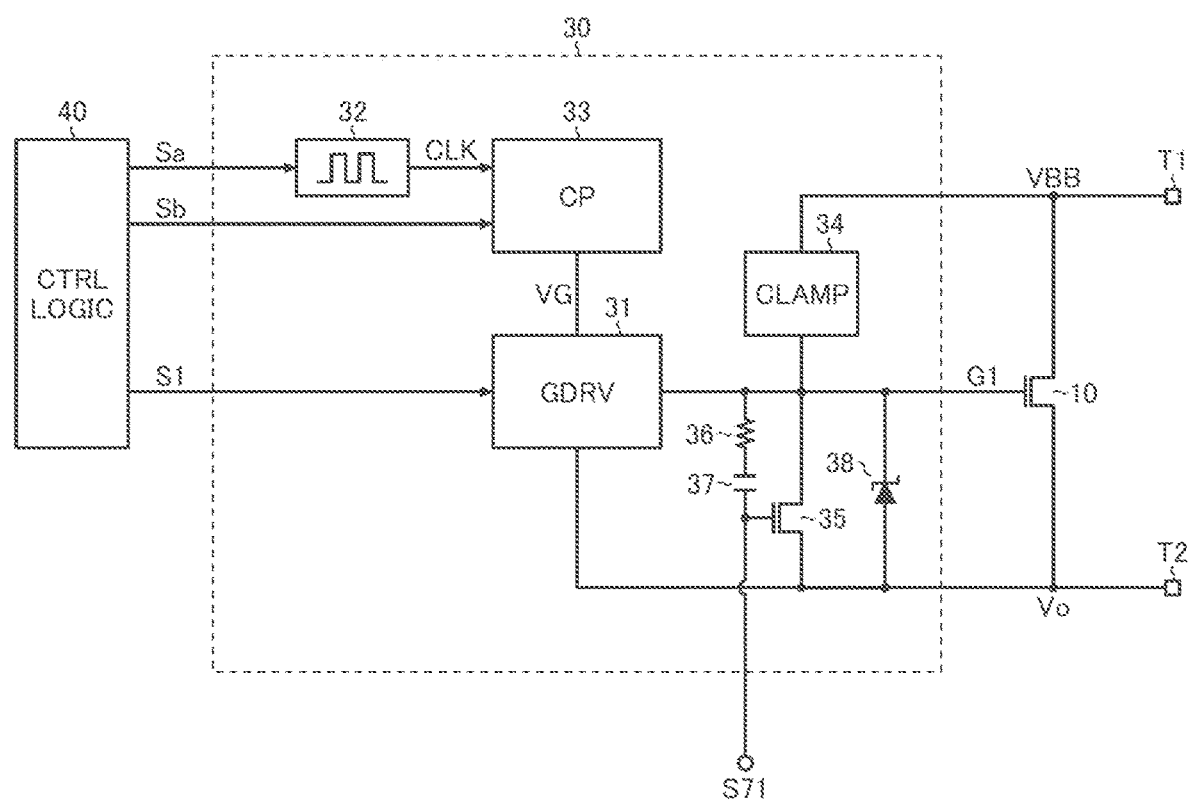
FIG. 2 is a block diagram showing one configuration example of a gate controller.

FIG. 2 is a block diagram showing one configuration example of a gate controller 30. The gate controller 30 of this configuration example includes a gate driver 31, an oscillator 32, a charge pump 33, a clamper 34, an NMOS-FET 35, a resistor 36 (with a resistance value R36), a capacitor 37 (with a capacitance value C37), and a Zener diode 38.

The gate driver 31 is connected between the output terminal of the charge pump 33 (that is, an application node for a boosted voltage VG) and the external terminal T2 (that is, an application node for the output voltage Vo) and generates the gate driving signal G1 by increasing the current capability of the gate control signal S1. Mere, the gate driving signal G1 is at high level (=VG) when the gate control signal S1 is at high level, and is at low level (=Vo) when the gate control signal S1 is at low level.

The oscillator 32 generates a clock signal CLK of a predetermined frequency to feed it to the charge pump 33. Whether or not to operate the oscillator 32 is controlled in accordance with an enable signal Sa from the control logic circuit 40.

The charge pump 33 is one example of a voltage booster which, by driving a flying capacitor using the clock signal CLK, generates a boosted voltage VG higher than the supply voltage VBB to supply the boosted voltage VG to the gate driver 31. Whether or not to operate the charge pump 33 is controlled in accordance with an enable signal Sb from the control logic circuit 40.

The clamper 34 is connected between the external terminal T1 (that is, the application node for the supply voltage VBB) and the gate of the NMOSFET 10. In an application in which an inductive load 3 is connected to the external terminal T2, when the NMOSFET 10 is turned from on to off, due to a counter-electromotive force in the load 3, the output voltage Vo falls to a negative voltage (<GND). To cope with this, the clamper 34 (what is called an active clamp circuit) is provided for absorbing energy.

The drain of the NMOSFET 35 is connected to the gate of the NMOSFET 10. The source of the NMOSFET 35 is connected to the external terminal T2. The gate of the NMOSFET 35 is connected to an application node for the overcurrent protection signal S71. Between the drain and the gate of the NMOSFET 35, the resistor 36 and the capacitor 37 are connected in series.

The cathode of the Zener diode 38 is connected to the gate of the NMOSFET 10. The anode of the Zener diode 38 is connected to the source of the NMOSFET 10. So connected, the Zener diode 38 functions as a clamping element for limiting the gate-source voltage (=VG−Vo) of the NMOSFET 10 such that it remains equal to or lower than a predetermined value.

In the gate controller 30 of this configuration example, when the overcurrent protection signal S71 is raised to high level, the gate driving signal G1 is lowered, from high level (=VG) in steady operation, at a predetermined time constant τ (=R36×C37). As a result, the conductivity of the NMOSFET 10 gradually lowers to limit the output current Io. On the other hand, when the overcurrent protection signal S71 is dropped to low level, the gate driving signal G1 is raised at the predetermined time constant τ. As a result, the conductivity of the NMOSFET 10 gradually rises to cease to limit the output current Io.

In this way, the gate controller 30 of this configuration example has a function of controlling the gate driving signal G1 so as to limit the output current Io in accordance with the overcurrent protection signal S71.

First Active Clamper

Figure 3:
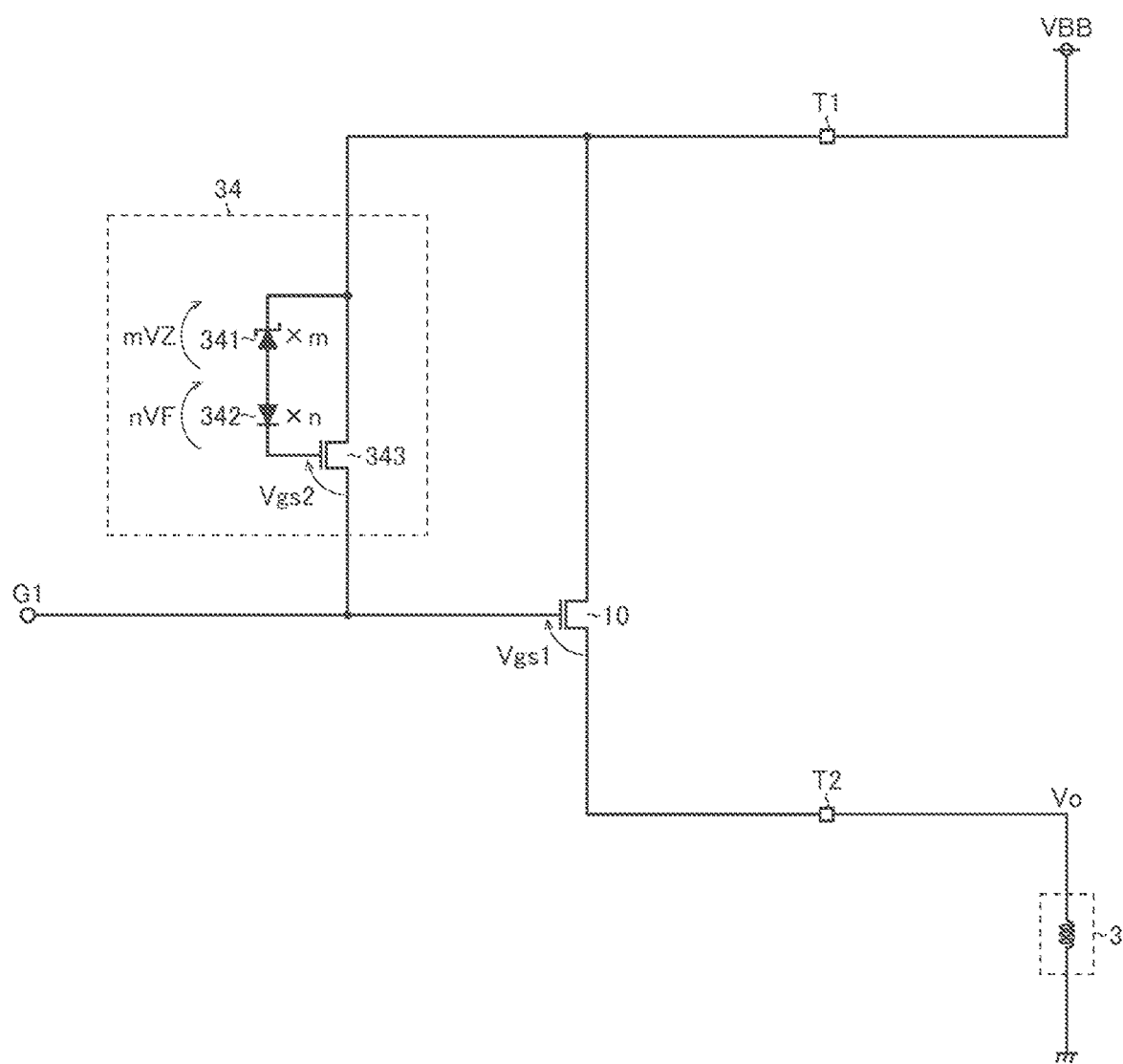
FIG. 3 is a diagram showing one configuration example of a first active clamper.

FIG. 3 is a diagram showing one configuration example of the clamper 34 (corresponding to a first active clamper). The clamper 34 of this configuration example includes an m-element Zener diode array 341 (for example, m=8), an n-element diode array 342 (for example, n=3), and an NMOSFET 343.

The cathode of the Zener diode array 341 and the drain of the NMOSFET 343 are, along with the drain of the NMOSFET 10, connected to the external terminal T1 (corresponding to a first terminal connected to the application node for the supply voltage VBB). The anode of the Zener diode array 341 is connected to the anode of the diode array 342. The cathode of the diode array 342 is connected to the gate of the NMOSFET 343. The source of the NMOSFET 343 is connected to the gate of the NMOSFET 10 (that is, an application node for the gate driving signal G1). The source of the NMOSFET 10 is connected to the external terminal T2 (corresponding to a second terminal connected to the first end of the load 3). As a load 3, an inductive load such as a coil or a solenoid can be connected.

The first active clamping operation by the clamor 34 will now be described assuming that the respective gate-source voltages of the NMOSFETs 10 and 343 are Vgs1 and Vgs2, that the breakdown voltage of the Zener diode array 341 is mVZ, and that the forward drop voltage of the diode array 342 is nVF.

Figure 4:
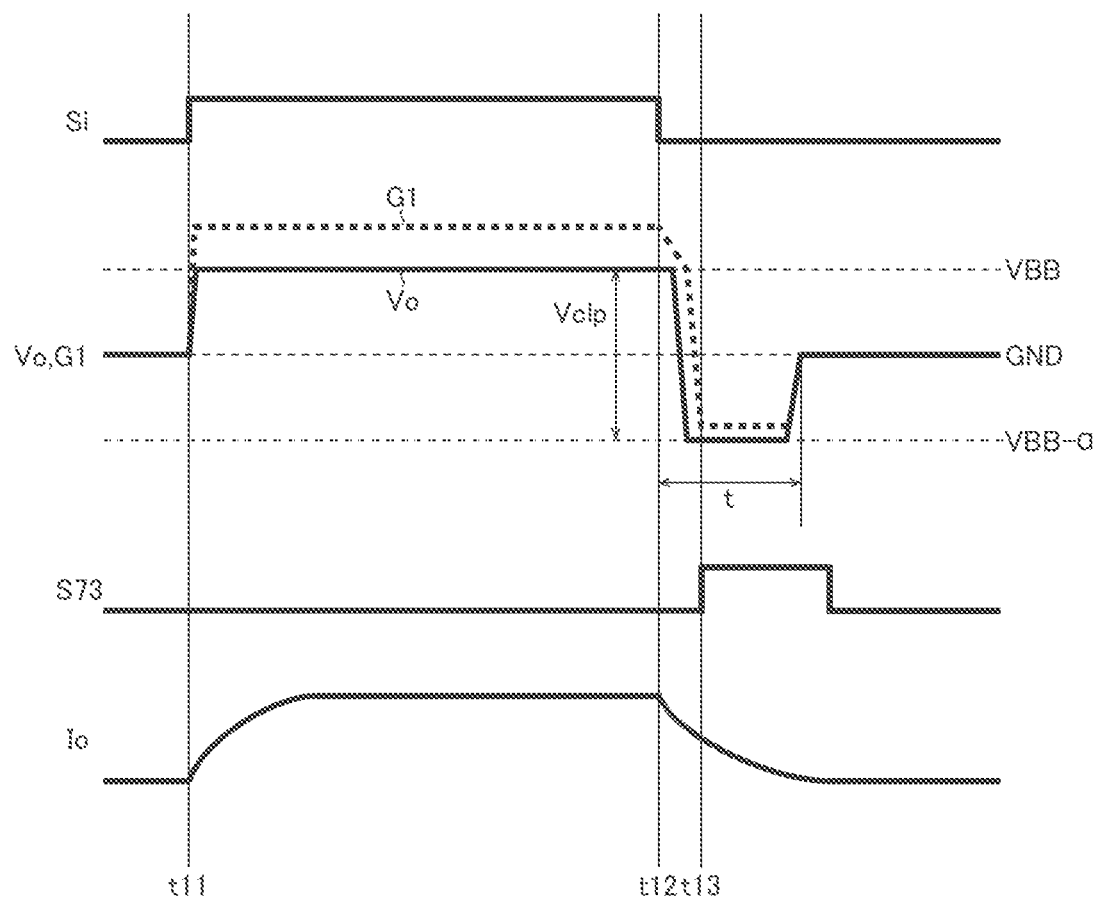
FIG. 4 is a diagram showing first active clamping operation.

FIG. 4 is a timing chart showing the first active clamping operation by the clamper 34, illustrating, from top down, the external control signal Si, the output voltage Vo (indicated by a solid line) and the gate driving signal G1 (indicated by a broken line), the temperature protection signal S73, and the output current Io. In this diagram, it is assumed that an inductive load is connected as a load 3.

At lime point t11, when the external control signal Si is raised to high level (the logic level that turns on the NMOSFET 10), the gale driving signal G1 is raised to high level and the NMOSFET 10 turns on; thus the output current Io starts to flow and the output voltage Vo rises to near the supply voltage VBB.

Then, at time point t12, when the external control signal Si is dropped to low level (the logic level that turns off the NMOSFET 10), the gate driving signal G1 falls to low level, and the NMOSFET 10 turns off. Here, the inductive load (such as a coil and a solenoid) connected as the load 3 continues to let the output current Iout flow until the energy stored during the on-period of the NMOSFET 10 is discharged. As a result, the output voltage Vo drops down to a negative voltage lower than the ground voltage GND.

Here, when the output voltage Vo falls to a negative voltage, by the action of the clamper 34, the NMOSFET 10 turns on, and thus the output current Io is discharged. In this way, the output voltage Vo is limited to equal to or higher than a lower limit voltage VBB−α (for example, VBB−50 V) which is lower than the supply voltage VBB by a predetermined value α (=mVZ+nVF+Vgs1+Vgs2).

That is, the clamper 34, by limiting the output voltage Vo with reference to the supply voltage VBB, limits the drain-source voltage Vds (=VBB−Vo) of the NMOSFET 10 such that it remains equal to or lower than a predetermined clamp voltage Vclp (=α).

The clamp voltage Vclp needs to be set at a voltage value higher than the maximum rated value of the supply voltage VBB but lower than the drain-source withstand voltage of the NMOSFET 10. The higher the clamp voltage Vclp, the higher the performance of the semiconductor integrated circuit device 1. However, from the perspective of its active clamping tolerance E (mJ), a low clamp voltage Vclp is preferable.

The active clamping tolerance E (mJ) of the semiconductor integrated circuit device 1 is calculated, using the clamp voltage Vclp (V), the output current Io (A), and a discharge time t (ms), according to the following formula.

$$E(J)=Vclp(V) \times Io(A) \times t(ms)$$

Incidentally, a power IC including an IPD is subjected to a load short-circuiting reliability test (AEC-Q100-012) in which, with the output terminal short-circuited to power or ground via a path having an inductance (for example, 5 mH), the power IC is turned on and off repeatedly over a plurality of cycles (300 to 1 million cycles depending on the grade).

Here, when the overcurrent limit value of the power IC is set at several tens of amperes to 100 A, power as high as several hundred waits to 1000 W is consumed. Thus, the power IC is turned on an off repeatedly in a state where overheating is detected (a high-temperature state: a state where, for example, starting at time point t13 in FIG. 4, the temperature protection signal S73 is raised to high level).

In such a high-temperature state, due to heat, the active clamping tolerance E (mJ) of the semiconductor integrated circuit device 1 lowers. Thus, to prevent thermal breakdown of the NMOSFET 10 and the like, it is preferable to lower the clamp voltage Vclp. However, with the clamper 34, which limits the output voltage Vo with reference to the supply voltage VBB, there is a limit to the width over which it can lower the clamp voltage Vclp. Thus, a second active clamper will be proposed below which can limit the output voltage Vo with reference to the ground voltage GND in a high-temperature state.

Second Active Clamper

Figure 5:
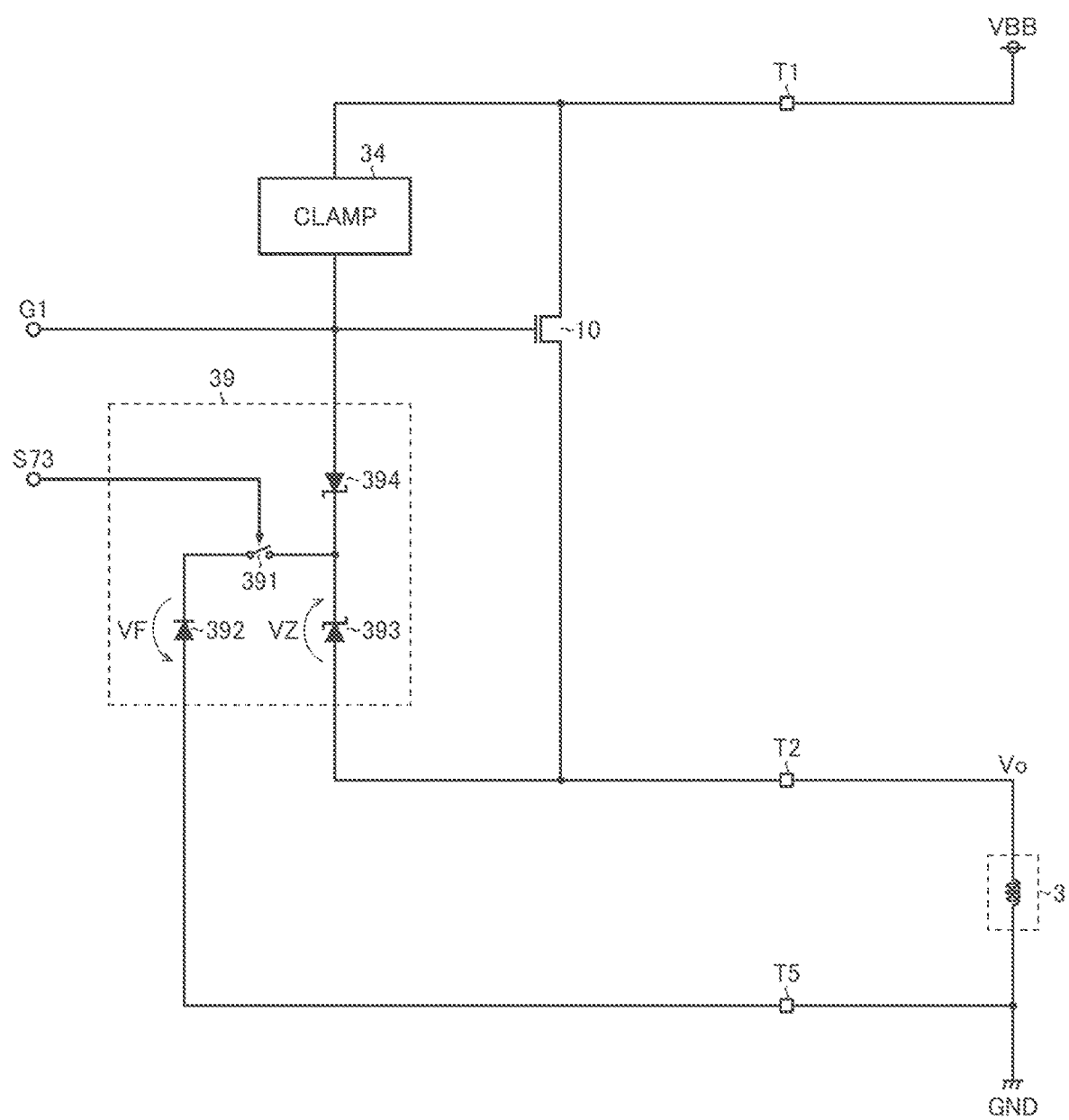
FIG. 5 is a diagram showing one configuration example of a second active clamper.

FIG. 5 is a diagram showing one configuration example of a clamper 39 (corresponding to a second active clamper). The clamper 39 of this configuration example includes a switch circuit 391, a diode 392, and Zener diodes 393 and 394.

The switch circuit 391 turns on and off in accordance with the temperature protection signal S73. More specifically, the switch circuit 391 is on in a high-temperature state (S73=H) and is off in a non-high-temperature state (S73=L).

The cathode of the diode 392 is connected to the first end of the switch circuit 391. The anode of the diode 392 is connected to the external terminal T5 (corresponding to a third terminal connected to the second end of the load 3 and to an application node for the ground voltage GND). The respective cathodes of Zener diodes 393 and 394 are connected to the second end of the switch circuit 391. The anode of the Zener diode 393 is connected to the external terminal 12. The anode of the Zener diode 394 is connected to the gate of the NMOSFET 10.

The second active clamping operation by the clampers 34 and 39 will now be described assuming that the breakdown voltage of the Zener diode 393 is Vz and that the forward drop voltage of the diode 392 is Vf.

Figure 6A:
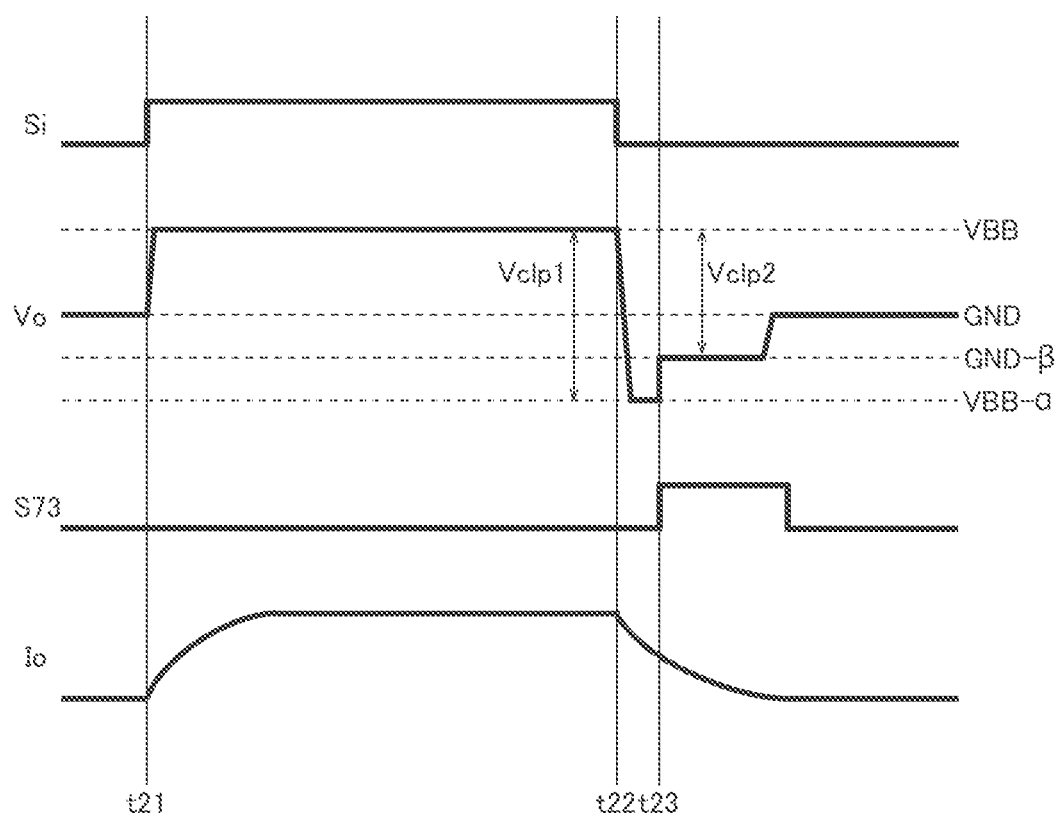
FIG. 6A is a diagram showing second active clamping operation (a first example)

FIG. 6A is a timing chart showing the second active clamping operation (a first example) by the clampers 34 and 39, illustrating, from top down, the external control signal Si, the output voltage Vo, the temperature protection signal S73, and the output current Io. Also in this diagram, it is assumed that an inductive load is connected as the load 3.

At time point t21, when the external control signal Si is raised to high level (the logic level that turns on the NMOSFET 10), the NMOSFET 10 turns on; thus the output current Io starts to flow and the output voltage Vo rises to near the supply voltage VBB. It is assumed that, at this point, no overheating is detected in the semiconductor integrated circuit device 1 and the temperature protection signal S73 is at low level (that is, the logic level in a non-high-temperature state).

Then, at time point t22, when the external control signal Si is dropped to low level (the logic level that turns off the NMOSFET 19), the NMOSFET 10 turns off. Here, the inductive load (such as a coil and a solenoid) connected as the load 3 continues to let the output current Iout flow until the energy stored during the on-period of the NMOSFET 10 is discharged. As a result, the output voltage Vo drops down to a negative voltage lower than the ground voltage GND.

Here, when the output voltage Vo falls to a negative voltage, by the action of the clamper 34, the NMOSFET it) turns on, and thus the output current Io is discharged. In this way, the output voltage Vo is limited to equal to or higher than a lower limit voltage VBB−α (for example, VBB−50 V) which is lower than the supply voltage VBB by a predetermined value α (=mVZ+nVF+Vgs1+Vgs2).

That is, the clamper 34, by limiting the output voltage Vo with reference to the supply voltage VBB, limits the drain-source voltage Vds (=VBB−Vo) of the NMOSFET 10 such that it remains equal to or lower than a predetermined clamp voltage Vclp (=α). The active clamping operation by the clamper 34 thus far is as described previously with reference to FIG. 4.

On the other hand, at time point t23, when overheating is detected in the semiconductor integrated circuit device 1 and the temperature protection signal S73 rises to high level (that is, the logic level in a high-temperature state), the switch circuit 391 turns on. As a result, a closed loop is formed via the switch circuit 391, the Zener diode 393, the load 3, and the diode 392, and thus the clamper 39 is activated. In this way, the output voltage Vo is limited to equal to or higher than a lower limit voltage GND−β (for example, GND−10 V) which is lower than the ground voltage GND by a predetermined value β (=Vz+Vf) but higher than the lower limit voltage VBB−β a mentioned above.

That is, the clamper 39, by limiting the output voltage Vo with reference to the ground voltage GND in a high-temperature state (S73=H), limits the drain-source voltage Vds (=VBB−Vo) of the NMOSFET 10 such that it remains equal to or lower than the clamp voltage Vclp2 lower than the clamp voltage Vclp1.

As described above, with the clamper 39 introduced, in a high-temperature state (S73=H) where the active clamping tolerance E (mJ) of the semiconductor integrated circuit device 1 is low, automatic switching takes place from the active damping operation with reference to the supply voltage VBB to that with reference to the ground voltage GND. It is thus possible to lower the clamp voltage Vclp to prevent thermal breakdown of the NMOSFET 10 and the like.

Figure 6B:
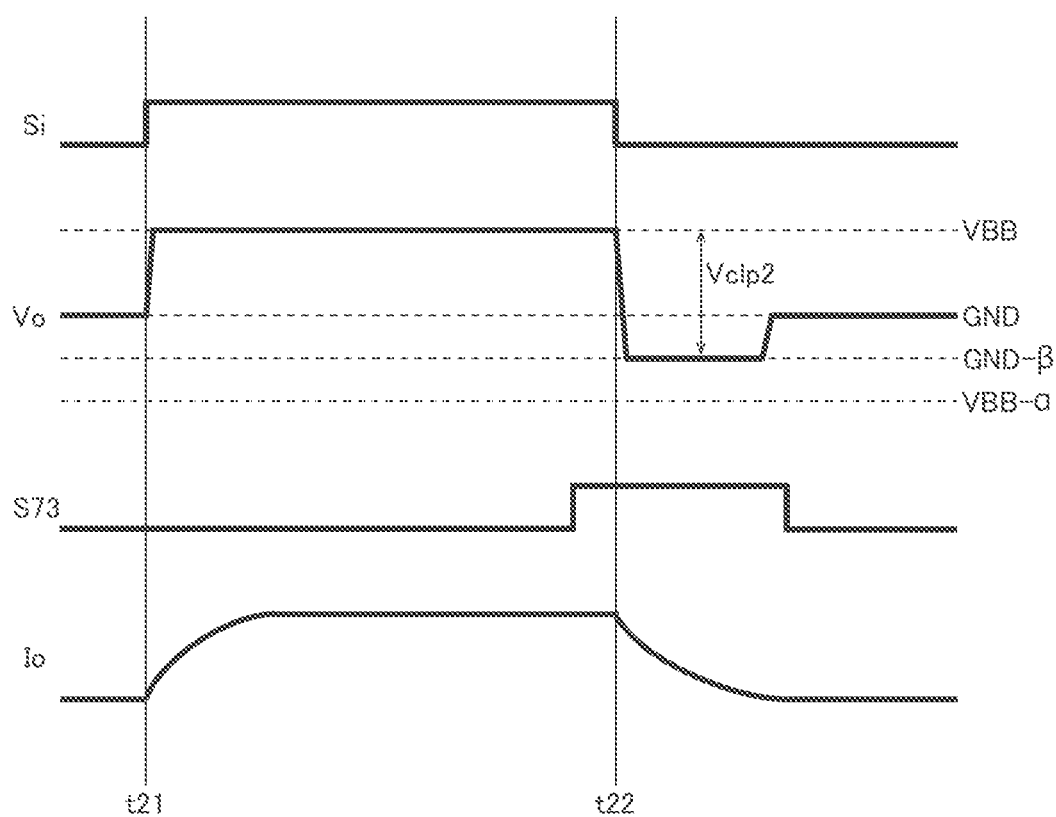
FIG. 6B is a diagram showing second active clamping operation (a second example)

FIG. 6B is a timing chart showing the second active clamping operation (a second example) by the clampers 34 and 39, illustrating, as in FIG. 6A referred to previously, from top down, the external control signal Si, the output voltage Vo, the temperature protection signal S73, and the output current Io. Also in this diagram, it is assumed that an inductive load is connected as the load 3.

As shown in FIG. 6B, if overheating in the semiconductor integrated circuit device 1 is detected (S73=H) before time point t22, when the output voltage Vo falls to a negative voltage at time point t22, the active clamping operation by the clamper 39 starts. Thus, the output voltage Vo, without, falling to the lower limit voltage VBB−α, is limited to the lower limit voltage GND−β from the beginning.

Application to Vehicles

Figure 7:
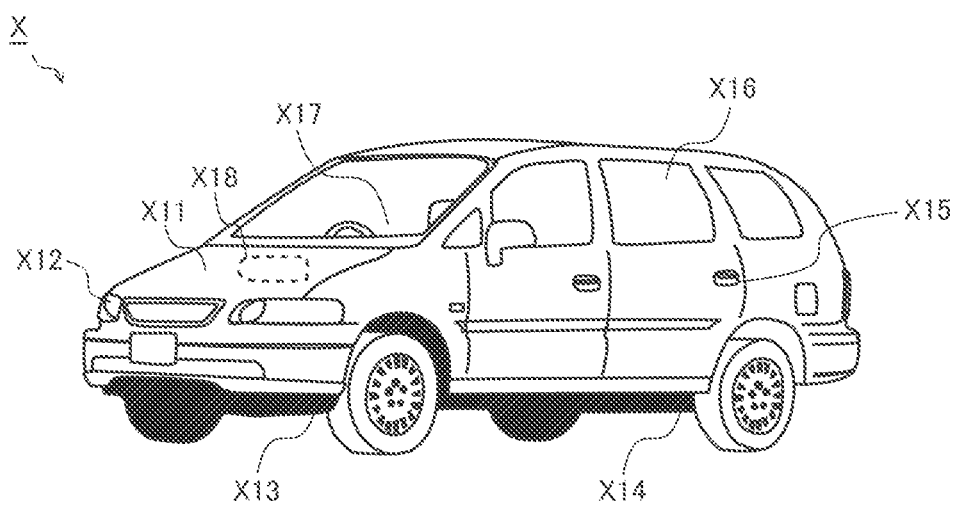
FIG. 7 is an exterior view showing one configuration example of a vehicle.

FIG. 7 is an exterior view showing one configuration example of a vehicle. The vehicle X of this configuration example incorporates a battery (unillustrated in FIG. 7) and various electronic appliances X11 to X18 that operate by being supplied with electric power from the battery. It should be noted that, for the sake of convenient illustration, the electronic appliances X11 to X18 may actually be arranged elsewhere than they are shown to be arranged in FIG. 7.

The electronic appliance X11 is an engine control unit that performs control with respect to the engine (such as the control of injection, electronic throttling, idling, an oxygen sensor heater, and automatic cruising).

The electronic appliance X12 is a lamp control unit that controls the turning on and off of HID (high intensity discharged) lamps, DRLs (daytime running lamps), and the like.

The electronic appliance X13 is a transmission control unit which performs control related to transmission.

The electronic appliance X14 is a body control unit that performs control with respect to the movement of the vehicle X (such as the control of an ABS (anti-lock brake system), EPS (electric power steering), and electronic suspension).

The electronic appliance X15 is a security control unit which controls the driving of door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as vehicle mounted AV (audio-visual) equipment, a car navigation system, and an ETC (electronic toll collection system).

The electronic appliance X18 are electronic appliances provided with a high-withstand-voltage motor such as a vehicle-mounted blower, an oil pump, a water pump, and a battery cooling fan.

The semiconductor integrated circuit device 1, the ECU 2, and the load 3 described above can be incorporated into any of the appliances X11 to X18.

OTHER MODIFIED EXAMPLES

Although the embodiments described above deal with a vehicle-mounted high-side switch IC as an example, the application of the invention disclosed herein is not limited to this. It can be widely applied, for example, not only to any other vehicle-mounted IPDs (such as vehicle-mounted low-side switch ICs and power supply ICs), but also to any semiconductor integrated circuit devices other than for vehicles.

Although the above embodiments deal with an example where the first active clamping operation and the second active clamping operation are switched depending on whether overheating is detected or not, put in more generic terms, it is possible to perform the first active clamping operation in a first state and the second active clamping operation in a second state different from the first state.

The various technical features disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

Overview

To follow is an overview of the various embodiments disclosed herein.

A switching device according to one aspect of what is disclosed herein has a first terminal connected to an application node for a first voltage, a second terminal connected to the first end of a load, a third terminal connected to the second end of the load and to an application node for a second voltage, a switching element connected between the first and second terminals, a first active clamper configured to limit the output voltage at the second terminal with reference to the first voltage in a first state, and a second active clamper configured to limit the output voltage with reference to the second voltage in a second state different from the first state (a first configuration).

In the switching device according to the first configuration, preferably, the first active clamper is configured to limit a terminal-to-terminal voltage across the switching element to equal to or lower than a first clamp voltage, and the second active clamper is configured to limit the terminal-to-terminal voltage across the switching element to equal to or lower than a second clamp voltage lower than the first clamp voltage (a second configuration).

In the switching device according to the first or second configuration, preferably, the first active damper is configured to limit the output voltage to equal to or higher than a first lower limit voltage lower than the first voltage by a predetermined value, and the second active clamper is configured to limit the output voltage to equal to or higher than a second lower limit voltage lower than the second voltage by a predetermined value but higher than the first lower limit voltage by a predetermined value (a third configuration).

In the switching device according to any one of the first to third configurations, preferably, the second active clamper includes a switch circuit configured to be on in the second state, a diode of which the cathode is connected to the first end of the switch circuit and of which the anode is connected to the third terminal, and a first Zener diode of which the cathode is connected to the second end of the switch circuit and of which the anode is connected to the second terminal (a fourth configuration).

In the switching device according to the fourth configuration, preferably, the second active clamper further includes a second Zener diode of which the cathode is connected to the second end of the switch circuit and of which the anode is connected to a control terminal of the switching element (a fifth configuration).

In the switching device according to any one of the first to fifth configurations, preferably, the first active clamper includes a Zener diode of which the cathode is connected to the first terminal, a diode of which the anode is connected to the anode of the Zener diode, and a transistor of which a first terminal, a second terminal, and a control terminal are connected respectively to the first terminal, the control terminal of the switching element, and the cathode of the diode (a sixth configuration).

In the switching device according to any one of the first to sixth configurations, preferably, the first voltage is a supply voltage and the second voltage is a ground voltage (a seventh configuration).

In the switching device according to any one of the first to seventh configurations, preferably, the first state is a state where no overheating is being detected and the second state is a state where overheating is being detected (an eighth configuration).

According to another aspect of what is disclosed herein, an electronic appliance disclosed herein includes the switching device according to any one of the first to eighth configurations and a load connected to the switching device (a ninth configuration).

In the electronic appliance according to the ninth configuration, preferably, the load is a bulb lamp, a relay coil, a solenoid, a light emitting diode, or a motor (a tenth configuration).

According to another aspect of what is disclosed herein, a vehicle comprising the electronic appliance according to the ninth or tenth configuration (an eleventh configuration).

INDUSTRIAL APPLICABILITY

The invention disclosed herein finds application in vehicle-mounted IPDs and the like.

What is claimed is:

1. A switching device comprising:
   a first terminal configured to be connected to an application node for a first voltage;
   a second terminal configured to be connected to a first end of a load;
   a third terminal configured to be connected to a second end of the load and to an application node for a second voltage;
   a switching element configured to be connected between the first and second terminals;
   a first active clamper configured to limit an output voltage at the second terminal with reference to the first voltage in a first state; and
   a second active clamper configured to limit the output voltage with reference to the second voltage in a second state different from the first state,
   wherein the second active clamper includes
     a switch circuit configured to be on in the second state,
     a diode of which a cathode is connected to a first end of the switch circuit and of which an anode is connected to the third terminal, and
     a first Zener diode of which a cathode is connected to a second end of the switch circuit and of which an anode is connected to the second terminal.

2. The switching device according to claim 1, wherein
   the first active damper is configured to limit a terminal-to-terminal voltage across the switching element to equal to or lower than a first clamp voltage, and
   the second active clamper is configured to limit the terminal-to-terminal voltage across the switching element to equal to or lower than a second clamp voltage lower than the first clamp voltage.

3. The switching device according to claim 1, wherein
   the first active damper is configured to limit the output voltage to equal to or higher than a first lower limit voltage lower than the first voltage by a predetermined value, and
   the second active damper is configured to limit the output voltage to equal to or higher than a second lower limit voltage lower than the second voltage by a predetermined value but higher than the first lower limit voltage by a predetermined value.

4. The switching device according to claim 1, wherein the second active damper further includes a second Zener diode of which a cathode is connected to the second end of the switch circuit and of which an anode is connected to a control terminal of the switching element.

5. The switching device according to claim 1, wherein the first active damper includes
   a Zener diode of which a cathode is connected to the first terminal,
   a diode of which an anode is connected to an anode of the Zener diode, and
   a transistor of which a first terminal, a second terminal, and a control terminal are connected respectively to the first terminal, a control terminal of the switching element, and the cathode of the diode.

6. The switching device according to claim 1, wherein the first voltage is a supply voltage and the second voltage is a ground voltage.

7. The switching device according to claim 1, wherein the first state is a state where no overheating is being detected and the second state is a state where overheating is being detected.

8. An electronic appliance comprising:
   the switching device according to claim 1; and
   a load connected to the switching device.

9. The electronic appliance according to claim 8, wherein the load is a bulb lamp, a relay coil, a solenoid, a light emitting diode, or a motor.

10. A vehicle comprising the electronic appliance according to claim 8.

11. A switching device comprising:
    a first terminal configured to be connected to an application node for a first voltage;
    a second terminal configured to be connected to a first end of a load;
    a third terminal configured to be connected to a second end of the load and to an application node for a second voltage;
    a switching element configured to be connected between the first and second terminals;
    a first active clamper configured to limit an output voltage at the second terminal with reference to the first voltage in a first state; and
    a second active clamper configured to limit the output voltage with reference to the second voltage in a second state different from the first state,
    wherein the first active clamper includes
      a Zener diode of which a cathode is connected to the first terminal,
      a diode of which an anode is connected to an anode of the Zener diode, and
      a transistor of which a first terminal, a second terminal, and a control terminal are connected respectively to the first terminal, a control terminal of the switching element, and the cathode of the diode.

12. The switching device according to claim 11, wherein
    the first active damper is configured to limit a terminal-to-terminal voltage across the switching element to equal to or lower than a first clamp voltage, and
    the second active clamper is configured to limit the terminal-to-terminal voltage across the switching element to equal to or lower than a second clamp voltage lower than the first clamp voltage.

13. The switching device according to claim 11, wherein
   the first active damper is configured to limit the output voltage to equal to or higher than a first lower limit voltage lower than the first voltage by a predetermined value, and
   the second active damper is configured to limit the output voltage to equal to or higher than a second lower limit voltage lower than the second voltage by a predetermined value but higher than the first lower limit voltage by a predetermined value.

14. The switching device according to claim 11, wherein the first voltage is a supply voltage and the second voltage is a ground voltage.

15. The switching device according to claim 11, wherein the first state is a state where no overheating is being detected and the second state is a state where overheating is being detected.

16. An electronic appliance comprising:
    the switching device according to claim 11; and
    a load connected to the switching device.

17. The electronic appliance according to claim 16, wherein the load is a bulb lamp, a relay coil, a solenoid, a light emitting diode, or a motor.

18. A vehicle comprising the electronic appliance according to claim 16.

* * * * *